United States Patent
Lindley et al.

(10) Patent No.: US 6,326,307 B1
(45) Date of Patent: Dec. 4, 2001

(54) PLASMA PRETREATMENT OF PHOTORESIST IN AN OXIDE ETCH PROCESS

(75) Inventors: Roger A. Lindley, Santa Clara; Henry Fong, Daly City; Yunsang Kim, San Jose, all of CA (US); Takehito Komatsu, Chiba (JP); Ajey M. Joshi, San Jose, CA (US); Bryan Y. Pu, San Jose, CA (US); Hongqing Shan, San Jose, CA (US)

(73) Assignee: Appllied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/440,792

(22) Filed: Nov. 15, 1999

(51) Int. Cl.$^7$ .................................................. H01L 21/302
(52) U.S. Cl. ........................ 438/689; 710/712; 710/713
(58) Field of Search .................... 438/710, 712, 438/689, 713

(56) References Cited

U.S. PATENT DOCUMENTS

| | | | |
|---|---|---|---|
| 4,764,248 | * 8/1988 | Bhattacherjee et al. | 156/643 |
| 4,814,041 | * 3/1989 | Auda | 156/643 |
| 5,320,934 | * 6/1994 | Misium et al. | 430/315 |
| 5,591,673 | * 1/1997 | Chao et al. | 437/192 |
| 5,795,804 | * 8/1998 | Jenq | 438/244 |

* cited by examiner

Primary Examiner—Benjamin L. Utech
Assistant Examiner—Vanessa Perez-Ramos
(74) Attorney, Agent, or Firm—Charles Guenzer

(57) ABSTRACT

A photoresist plasma pretreatment performed prior to a plasma oxide etch. The plasma pretreatment is performed with an argon plasma or a carbon tetrafluoride and trifluoromethane plasma with lower power than in the main etch or is performed with a plasma of difluoromethane or trifluoromethane and carbon monoxide but no argon diluent gas. Thereby, striations on the oxide wall are reduced.

28 Claims, 5 Drawing Sheets and may be as thick as 2 or 3 $\mu$m in some situations.
PLASMA PRETREATMENT OF PHOTORESIST IN AN OXIDE ETCH PROCESS

FIELD OF THE INVENTION

The invention relates generally to lithographic etching of semiconductor integrated circuits. In particular, the invention relates to the treatment of photoresist just before the etching step that uses the patterned resist as an etching mask.

BACKGROUND ART

Modern semiconductor integrated circuits typically include several metallization layers. Each metallization layer includes a dielectric layer, for example, of silicon dioxide. Other dielectric materials are being developed, for example, having lower dielectric constants than silica. However, at this time, silica remains the dominant dielectric material, and many of the low-k dielectrics are based on silica with perhaps the addition of some dopants or a significant amount of carbon. For these reasons, the dielectric layer is often simply referred to as the oxide layer. However, some low-k dielectrics being proposed are primarily based on carbon and oxygen with very little silicon.

Contact or via holes are etched through the oxide layer and are thereafter filled with a metal to provide vertical interconnects through the oxide layer to electrically contact an underlying conductive feature. Horizontally extending interconnects are formed over the dielectric layer. A yet higher metallization layer may then be formed on the already formed lower metallization layer. Advanced microprocessors have five or more metallization layers to provide the complex interconnections in a large logic structure.

Vertical interconnects to an underlying semiconductor layer are called contacts while vertical interconnects to an underlying metal layer are called vias. Hereafter, reference will be made only to vias, but the discussion applies with very few changes to contacts. The discussion also applies to other high aspect-ratio holes such as narrow trenches extending fully or partially through an oxide layer.

One of the most demanding steps in the fabrication of semiconductor integrated circuits is the etching of the via holes. The oxide layer is almost always at least 0.7 $\mu$m thick and may be as thick as 2 or 3 $\mu$m in some situations. However, the extremely dense circuitry of advanced integrated circuits is achieved in part by reducing the width of the vias. A 0.35 $\mu$m-wide via is typical for lower levels of modern circuitry. Via widths of 0.25 $\mu$m are not uncommon. In newer and planned chips, the via widths are being reduced even further 0.18 $\mu$m and below. Contact holes tend to be narrower and have higher aspect ratios than via holes. As a result, such holes have very high aspect ratios, and it is generally difficult to etch a narrow deep hole. Further, because of the high aspect ratios, the via holes must have profile angles approaching 90°. Lastly, the etch must be selective to the photomask defining the etch, and must also be selective to the underlying material, which may be a metal layer or an etch stop layer composed of silicon nitride or titanium nitride, for example.

Nonetheless, etch processes have been developed satisfying these many requirements. Such oxide etching is typically performed as a dry etch process in a plasma etching reactor using a fluorocarbon etching chemistry.

However, a recurring problem in oxide etching is that, under some ill defined conditions, striations are formed in the oxide on the sides of the via holes. Striations are vertically extending non-uniformities generally resembling flutes in a column but with a much rougher and irregular topography. As a result, the via holes have sides that may be very rough. Their formation is illustrated in the sectioned isometric views of FIGS. 1 and 2 showing the selective and anisotropic oxide etching to form a via. A lower oxide layer 10 forming a lower-level dielectric layer is illustrated much thinner than is realistic, and the underlying silicon structure is not illustrated. A metal line 12, for example, of aluminum is formed over the lower oxide layer 10 and is connected through it by unillustrated vias or contacts to the underlying structure. A conformal stop layer 14 of, for example, silicon nitride or titanium nitride, is deposited over the metal line 12 and the lower oxide layer 10. An upper oxide layer 16 is deposited and forms the inter-level dielectric for this level. A photoresist layer 18 is spun onto the upper oxide layer 16 and is photographically patterned to form a photomask aperture 20 over the intended via hole. For advanced lithography, an anti-reflection coating (ARC) is typically disposed between the photoresist layer 18 and the oxide layer 16 to aid the photographic resolution.

Photoresist is typically an organic polymer similar to photographic emulsion that can be exposed to light and developed to form patterns such as the aperture 20. For advanced devices, the photolithographic light is in the spectral range of deep ultraviolet (DUV) around 248 nm. Such DUV photoresists are commercially available from a number of suppliers. Electron or X-ray patterning of the photomask are also known. At this stage of processing prior to the oxide etching, the top photoresist surface 22 and the photoresist sidewalls 24 are smooth although annular ridges often form on the sidewalls arising from interference undulation patterns of the imaging radiation.

After the formation of the photomask, the wafer is transferred to a plasma etch reactor for etching the via hole into the oxide layer 16. Highly selective and anisotropic plasma etch processes are known which etch a vertical hole in the oxide with selectivity to both the photoresist 18 and the nitride layer 14. These processes are typically based on fluorine chemistry, most typically including a fluorocarbon. After the oxide is etched, the photoresist is stripped. However, as shown in FIG. 2, the resulting via hole 26 may be formed with vertically extending striations 28. It is noted that the nitride layer 14 at the bottom of the via hole 26 is usually removed in a separate etch step which may precede or follow the photoresist stripping.

Filling a metal, such as tungsten, into high aspect-ratio via holes is difficult enough when the via sidewalls are smooth. Hole filling becomes much more difficult in the presence of strong striations. Furthermore, striations are generally acknowledged to degrade the performance and reliability of integrated circuits.

The mechanism of the formation of striations is not well understood. It is generally believed that striations initially form on the sidewalls of the apertures in the photolithographic mask and somehow grow and propagate downwardly into the via hole being etched.

Until now, striations have been treated as yet another constraint on the set of useful processing parameters. Just as good selectivity or good profiles are obtained over a processing window that needs to be experimentally determined for as wide a window as possible, so too the processing window must not result in excessive striations. Some parameter values and particular etching gases have been discovered to be excessively prone to striations, and so these are avoided. However, conventionally this determination has been primarily empirical, and each new or revised chemistry requires a redetermination of its susceptibility to striations.

Accordingly, it is desired to provide a processing technique that can be more generally applied to reliably reduce striations in oxide etching.

SUMMARY OF THE INVENTION

The invention includes a plasma treatment of the patterned photoresist prior to the main etch of the oxide layer. In one embodiment, the plasma treatment is performed with a plasma of a noble gas, such as argon. In a second embodiment, the plasma treatment is performed with a plasma of a fluoromethane, and the main etch is performed with a higher power with a heavier fluorocarbon. In the first and second embodiments, the plasma treatment is preferably performed at a lower power than the main etch. In a third embodiment, the plasma pretreatment includes difluoromethane or monofluoromethane and other etching gases but no argon.

DETAILED DESCRIPTION OF THE PREFERRED EMBODIMENTS

Figure 1:
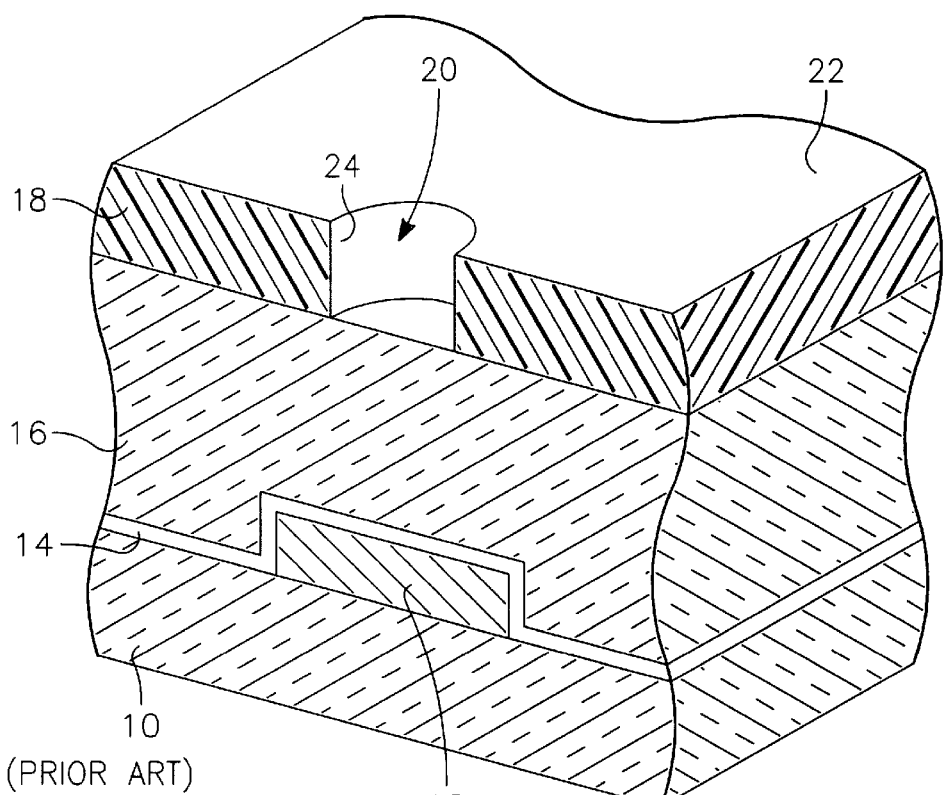
FIGS. 1 and 2 are schematic isometric views, partly in section, illustrating the formation of striations in an interlevel dielectric during a dielectric etch process.
Figure 2:
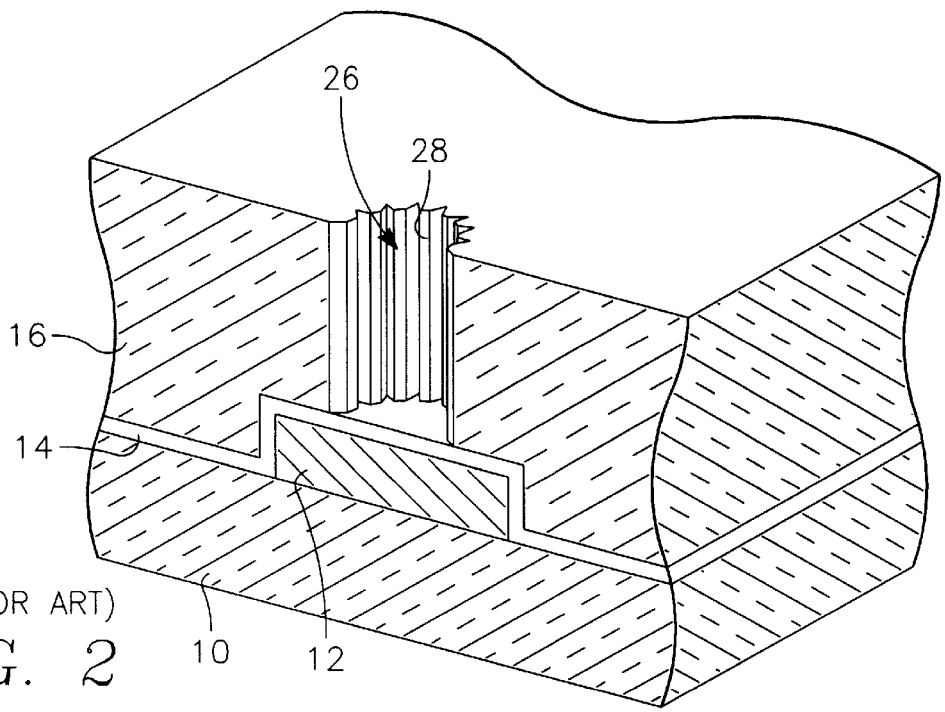

Although our invention is not limited by our theory of its operation, we believe that the formation of striations in an oxide etch originates in the polymer that is crucial to the anisotropic and selective etch of oxide materials. During a fluorocarbon-based etching to form the via hole 26 of FIG. 2, a polymer layer forms over both the top photoresist surface 22 of FIG. 1, the photoresist sidewalls 24, and the oxide sidewalls and horizontal bottom of the hole in the oxide as it is being etched. An anisotropic etch is achieved by catalyzing the etch process by the bombardment with energetic ions of the polymer at the bottom of the via hole. The anisotropic bombardment is achieved by ionized species, primarily positively charged argon ions that are accelerated across the plasma sheath to the negatively biased wafer. The atoms of the oxide being removed actually diffuse through the polymer layer and exit the hole in volatile form, such as silicon tetrafluoride. Once the via hole is etched down to the non-oxide underlayer 14, the bottom polymer selectively protects the underlayer 14 from being etched as quickly as the primary oxide was etched and, in turn, prevents the aluminum line 12 from being exposed to the plasma.

Examples of etch rates for a via etch are 500 nm/min for the oxide layer, 100 nm/min for the photoresist layer, and 25 nm/min for a TiN underlayer. Thus, a via hole can be etched in the oxide layer without completely removing the photoresist, and the TiN underlayer can be used as an etch stop layer. After the plasma etch is completed, the remaining photoresist and the deposited polymer can be removed through one or both of dry and wet stripping processes, generically known as stripping or ashing.

Figures 3, 5:
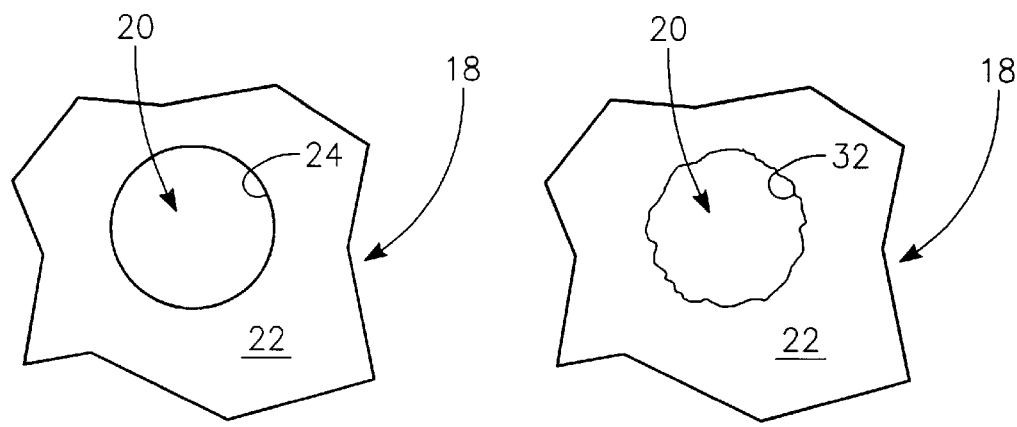
FIGS. 3 and 4 are respectively plan and sectioned isometric views of a patterned photomask prior to a dielectric etch.
FIGS. 5 and 6 are views corresponding to FIGS. 3 and 4 during the initial phase of the dielectric etch.
Figure 4:
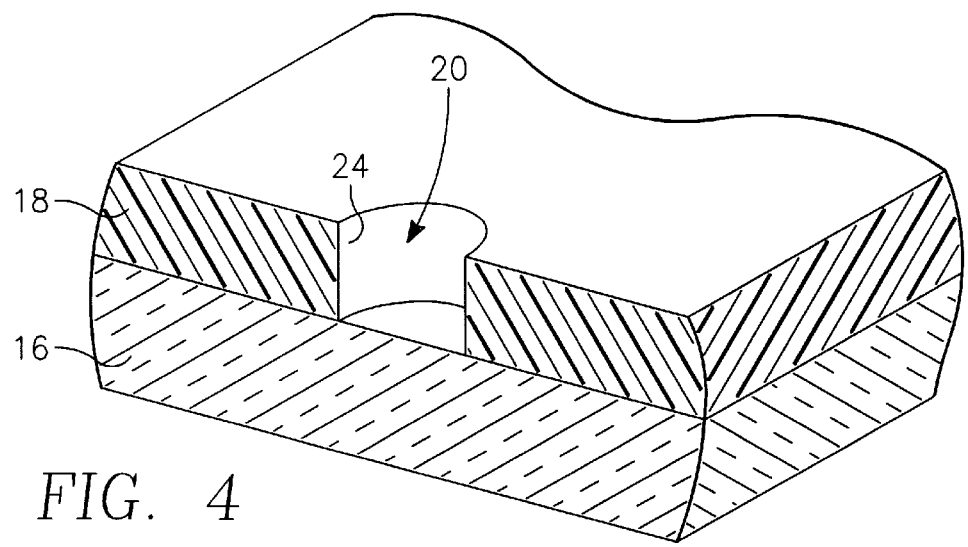
Figure 6:
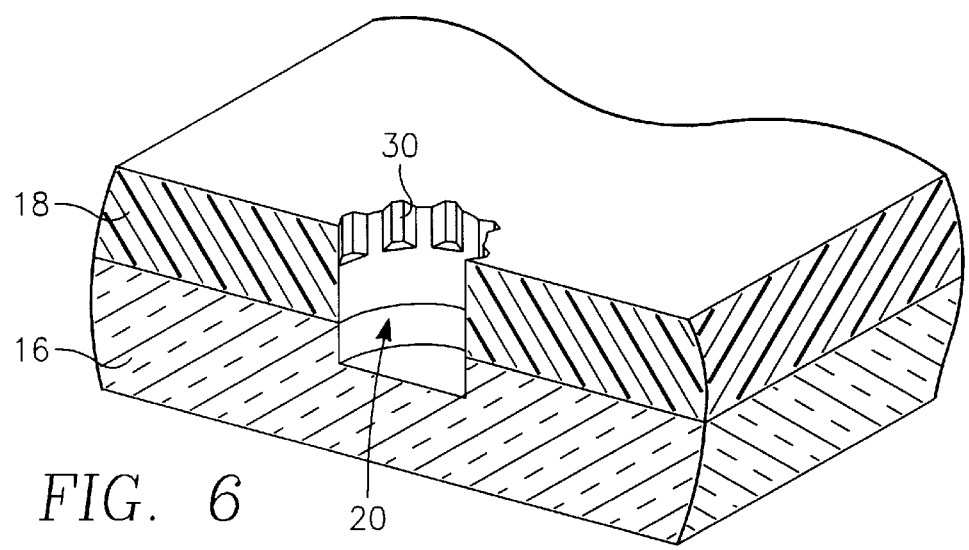

Before the plasma etching, as shown in the plan view of FIG. 3 and the sectioned isometric view of FIG. 4, the via hole opening 20 in the photoresist mask 18 can be made to have very smooth sidewalls 24 with the proper choice of lithography, photoresist developing, and post-development processing, as is well known in the art. During the plasma etching, however, the fluorocarbon plasma used in etching usually non-uniformly deposits a polymer on the top surface 22 of the photoresist, making the surface rough in comparison to that of the original photoresist. The roughness extends to the top lip of the photoresist via hole opening 24. As the photoresist layer is being etched, as illustrated in the plan and sectioned isometric views of FIGS. 5 and 6, the non-uniformly deposited polymer on top of the photoresist that is very near the via hole causes the side of the photomask to become rough and form indents 30 in the rough photoresist/polymer sidewall 32. These rough features 30 in the photomask then transfer downwardly with time during the plasma etch. With time, these rough features are mask transferred into the oxide, forming the undesired striations.

It is unknown at this time how to completely prevent these rough features from initially forming. Instead, striations in the oxide layer are prevented primarily by finding ways to delay their masked transfer into the oxide layer until a time that would be longer than that required to etch the desired hole into the oxide layer. These delaying tactics include, but are not limited to: (1) minimizing the degree of feature roughness induced in the photoresist; (2) reducing the etch rate of the photoresist layer; and (3) coating the oxide sidewalls so that the feature roughness is initially mask transferred only into the coating layer and not into the oxide. The present invention seems to rely upon the first and second approaches.

The striations thus seem to originate in the photoresist and propagate thence into the polymer overlying the oxide sidewall. The depth of the striations seems to increase with further etching. At some point, the depth of the striations exceed the thickness of the polymer layer, and the underlying oxide sidewall becomes exposed in some vertical extending areas. This oxide portion is thus left unprotected and is etched, and a striation is formed in the oxide. At the completion of etching, the polymer and any remaining photoresist are stripped in an ashing step. However, the striations in the oxide sidewall remain.

Figure 7:
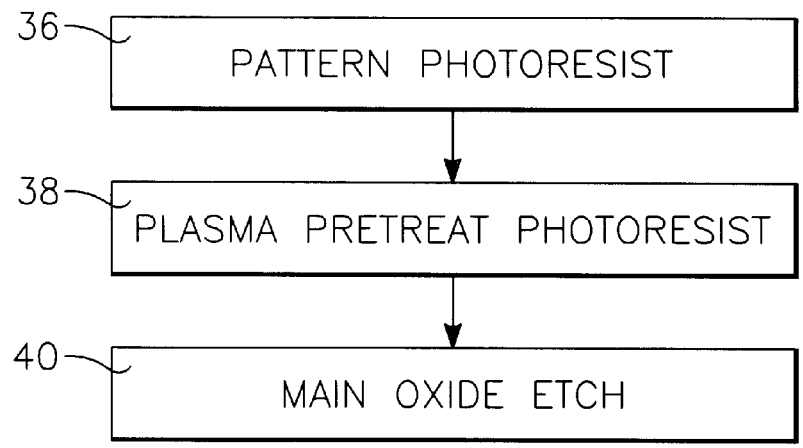
FIG. 7 is a flow diagram of a complete process of the invention.
Figure 8:
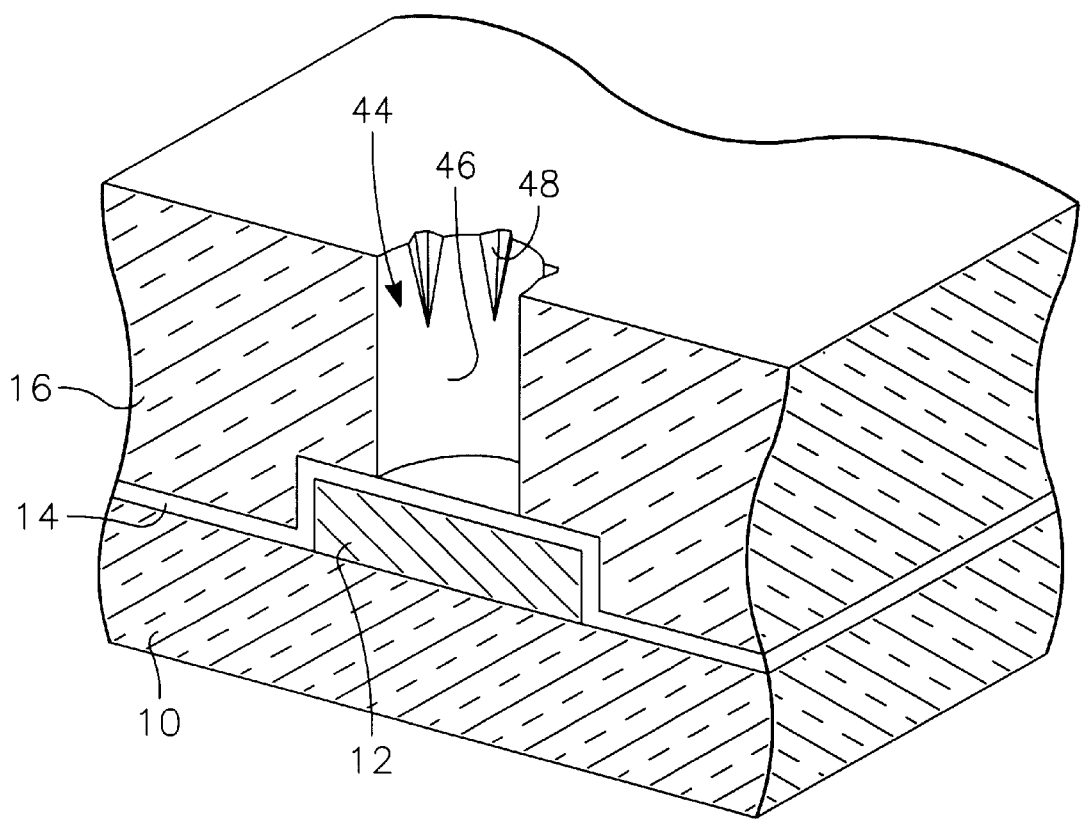
FIG. 8 is a sectioned isometric view of a via hole acheivable with the process of the invention.

According to the invention, the patterned photoresist is pretreated with a plasma prior to the main oxide etch. As illustrated in the process flow diagram of FIG. 7, in step 36, the photoresist spun on over the oxide layer is dried and photographically patterned, as is well known in photolithography. In step 38, the patterned photoresist is pretreated with a plasma. In step 40, the conventional main etch of the oxide layer is performed. Afterwards, the polymer and photoresist are ashed. This process produces an improved via hole 44, illustrated in the sectioned isometric view of FIG. 8, having a smoother sidewall 46. Small striations 48 may still remain in the oxide sidewall 46, but they are less severe than without the photoresist pretreatment.

Different types of plasma pretreatment have been tested in a magnetically enhanced reactive ion etch (MERIE) reactor, such as the super-e MxP etch reactor available from Applied Materials of Santa Clara, Calif. In this type of etch reactor, RF power is coupled to a pedestal electrode supporting the wafer to be etched. An etching gas is admitted into the chamber through a dielectric showerhead electrode in opposition to the pedestal electrode and surrounded by a grounded anode, including the chamber walls and chamber liners. A set of magnetic coils create a horizontally extending magnetic field that slowly rotates in the plane of the wafer. Rotating permanent magnets can achieve much the same effect. As will be explained later, the presence or absence of magnetic field is not considered crucial for the invention, whether in the main etch or the photoresist pretreatment.

A first two-step etch recipe is sunmarized in TABLE 1. The first, conditioning step is the photoresist plasma pretreatment, and the second step is the main oxide etch.

TABLE 1

|  |  | Condition | Main Etch |
|---|---|---|---|
| Flow (sccm) | $C_2F_6$ | 0 | 35 |
|  | $C_4F_8$ | 0 | 30 |
|  | Ar | 200 | 150 |
|  | Pressure (milliTorr) | 250 | 120 |
|  | Magnetic Field (gauss) | 0 | 30 |
|  | RF Power (W) | 400 | 1800 |
|  | Time(s) | 15 | 180 |

The powers tabulated above are those for a 200 mm wafer. For wafers of different sizes, the power scales approximately with wafer area. Additional parameters common to both steps include a pedestal temperature and a chamber wall temperature of 15° C. and a pressure of helium backside cooling gas of 16 Torr.

The photoresist conditioning of this embodiment is performed at relatively low power with an argon plasma and without a fluorine-based etchant. As a result, the exposed oxide is only slightly sputtered if at all while the more sensitive organic photoresist is being plasma treated.

The main etch is preferably performed in the same etch reactor as the photoresist pretreatment and without extinguishing the plasma between the two steps, thereby increasing throughput and avoiding possible additional ignition damage. That is, the conditioning transitions to the main etch by concurrently smoothly changing the gas flows and increasing the RF power and coil current. However, the plasma can be interrupted between the two steps if desired. The main etch is a fairly conventional one primarily relying upon the low-F/C fluorocarbon octafluorocyclobutane ($C_4F_8$) providing good bottom and sidewall protection and the high-F/C fluorocarbon hexafluoroethane ($C_2F_6$) providing stronger etching. A low-F/C fluorocarbon, as will be discussed in more detail later, has a ratio of fluorine to carbon atoms of two or less and no more than one hydrogen atom and results in a polymerizing plasma. The relatively high power and the magnetic field in the main etch promotes vertical etching and polymer selectivity. A main etch for 180s is sufficient to etch a 0.25 $\mu$m hole through about 1.5 $\mu$m of TEOS (tetraethylorthosilicate) oxide deposited in a plasma-enhanced chemical vapor deposition chamber.

This embodiment of the inventive conditioning step uses an argon plasma at reduced power and no magnetic field. The chamber pressure is higher than in the main etch.

A comparative test was performed using only the main etch and not the conditioning step. Significant striations are observed in the oxide sidewalls after the polymer ashing.

The complete recipe of TABLE 1 was tested with 0.35 $\mu$m vias in TEOS oxide and 0.73 $\mu$m of DUV patterned photoresist, just as in the comparative test. Before stripping, significant striping is observed in the photoresist and sidewall polymer. After stripping of the photoresist and polymer, a few striations are observed in oxide sidewall, but much reduced from the comparative example. That is, the photoresist striations do not significantly propagate into the oxide. An improvement in the severity of striations includes a reduction in the number of striations and a reduction in their size.

Sometimes, a bottom anti-reflective coating (BARC) of an organic layer is disposed between the photoresist and the oxide to aid the resolution of the photolithographic. If a BARC layer is present, a separate BARC removal etch is needed to accompany the argon pretreatment.

The same wafer also included 0.25 $\mu$m vias in the same vertical structure. The results show reduced striations over the comparative test of no pretreatment.

The time of the argon pretreatment needs to be limited. After 15 s of argon pretreatment, the photoresist lip is slightly beveled but relative smooth. After 30 s of argon pretreatment, the lip is roughened, and steps are beginning to form.

Suggestions have been made to plasma descum after resist development and to plasma harden the resist. See, for example: (1) Wolf et al., Silicon Processing for the VLSI Era, Vol. 1: Process Technology, (Lattice Press, Sunset Beach, Calif., 1986), pp.429, 446, 453; (2) Moreau, Semiconductor Lithography: Principles, Practices, and Materials, (Plenum, 1988), pp. 248, 709–712. The known types of descumming have used $O_2$, $O_2$/Ar, $CF_4$/Ar, or $CF_4$/$CHF_3$. The first two are most apparent in that an oxygen plasma breaks up organic polymers.

A second recipe for the preconditioning and main etches is summarized in TABLE

TABLE 2

|  |  | Condition | Main Etch |
|---|---|---|---|
| Flow (sccm) | $C_2F_6$ | 0 | 35 |
|  | $C_4F_8$ | 0 | 30 |
|  | $CF_4$ | 40 | 0 |
|  | $CHF_3$ | 20 | 0 |
|  | Ar | 0 | 150 |
|  | Pressure (milliTorr) | 120 | 120 |
|  | Magnetic Field (gauss) | 0 | 30 |
|  | RF Power (W) | 400 | 1800 |
|  | Time(s) | 15 | 180 |

The main etch is the same as in TABLE 1. However, the photoresist pretreatment uses a plasma of fluoromethanes, specifically, carbon tetrafluoride ($CF_4$) and trifluoromethane ($CHF_3$) in place of argon. The pressures of the pretreatment and the main etch are the same. Otherwise, the conditions are much as same as in TABLE 1.

Tests with 0.35 μm vias on the same wafer show the vias to be not quite as free of striation as with the argon pretreatment. However, when the fluoromethane recipe is tested with 0.25 μm vias, there is little difference from the argon pretreatment.

It is noted that the recipe of TABLE 2 resembles a conventional oxide recipe which includes an initial step of opening a BARC layer between the oxide layer and the photoresist. A low-power fluoromethane etch is sometimes used for the BARC open.

Another test was performed in which the pretreatment consisted of 15 s of the main etch recipe except the power was reduced to 400 W. That is, the pretreatment used a plasma of $C_2F_6$, $C_4F_8$, and Ar. The results show no significant benefit from the reduced power pretreatment.

Figure 9:
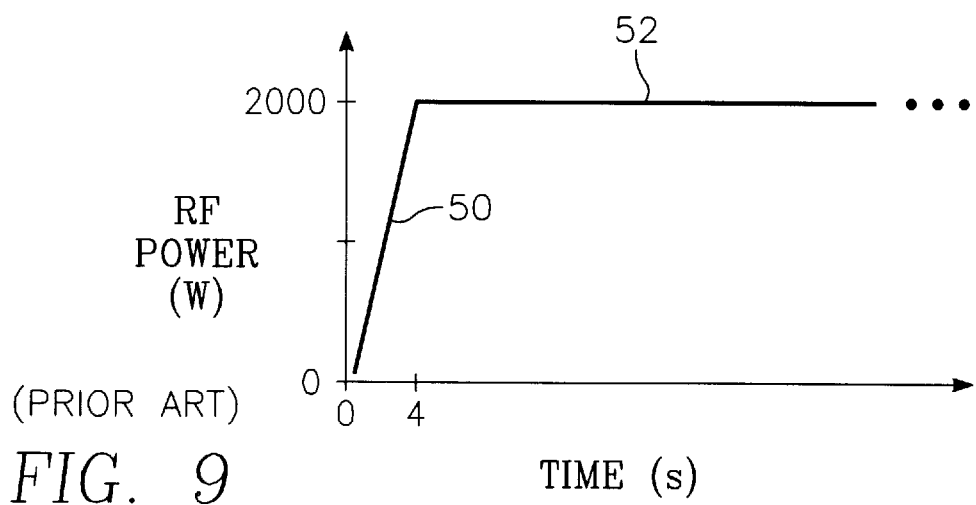
FIG. 9 is a graph showing the time dependence of the RF power applied in a conventional etch process.

The lack of beneficial results with a low-power, low-F/C fluorocarbon pretreatment should not be surprising since the conventional main etch provides a functionally similar process. Typically, the etching gas is first admitted to the chamber and then the RF power is ramped up at the rate of about 500 W/s, as illustrated in the graph of FIG. 9 plotting RF power as a function of time. This produces an initial power ramp 50 about 4 s long before the steady main etch power 52 of 1800 to 2000 W. In contrast, a 15 s, 500 W pretreatment results, as illustrated in the power-time plot of FIG. 10, in a low-power pretreatment 54 followed by the main etch 52. If the same low-F/C fluorocarbon gas recipe is used for the pretreatment and the main etch, the low-power pretreatment 54 is chemically similar to the conventional ramp 50. Of course a small amount of a low-F/C fluorocarbon can be included with the other two recipes, for example, less than 5%, without seriously degrading the benefit of those recipes.

Figure 10:
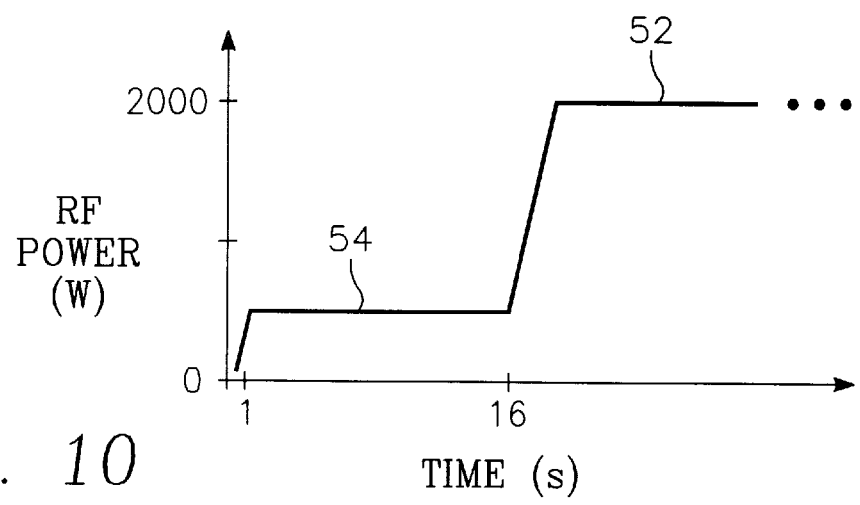
FIG. 10 is graph showing the time dependence of the RF power applied in an etch process incorporating a plasma pretreatment.
Figure 11:
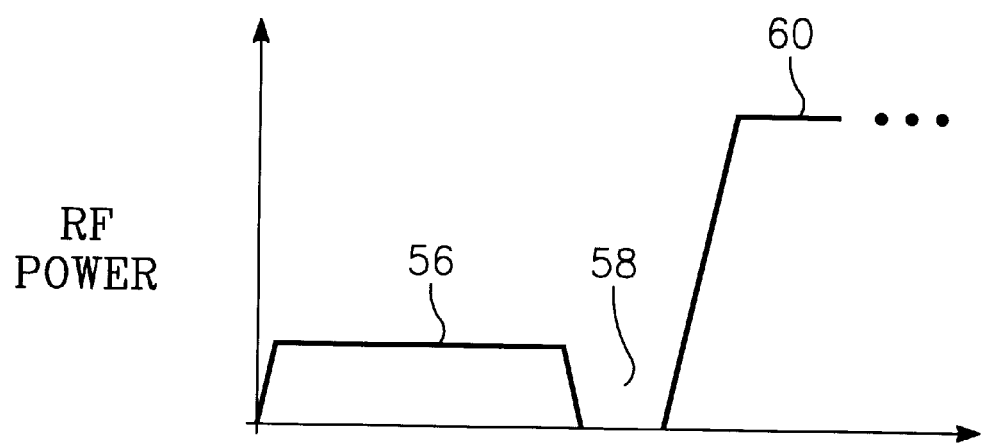
FIG. 11 is a graph showing an alternative time dependence of the RF power applied in the invention.

The time-power plot of FIG. 10 shows one of the sequences used with the embodiments of the invention using a low-power pretreatment followed by a high-power main etch. In this sequence, the plasma is not extinguished between the two steps. However, sometimes it is preferred to follow the sequence illustrated in the time-power plot of FIG. 11 in which, following a pretreatment 56, the plasma is extinguished, and during a quiescent period 58 the gas flows and pressure are changed and then allowed to equilibrate. Thereafter, the RF power is turned to a high level for a main etch 60.

The use of an argon pretreatment with higher power than that listed in TABLE 1 may introduce other problems precluding its effectiveness for precleaning. High power in a capacitively coupled plasma reactor results in high energy argon ions, which tend to sputter rather than chemically etch the exposed silica. The sputtered silica has been observed, when using a 1200 W argon plasma for a 200 mm wafer, to redeposit on the photoresist sidewalls, and the redeposited silica layer is often not removed during the photoresist and polymer ashing. Instead, a ring of redeposited material is left surrounding the top of the etch via hole. It is thus recommended that no more 800 W of RF power be used to excite the argon plasma.

The surface topography of the pretreated photoresist prior to the main etch has been evaluated. Untreated developed photoresist is generally very smooth. An argon pretreatment creates a surface layer that has a rough surface and is distinct from the photoresist. A comparison of thickness indicates that the surface layer is converted from the photoresist. On the other hand, a high-F/C fluorocarbon pretreatment results in a surface layer of similar topography, but the resulting surface layer appears to be deposited rather than converted from photoresist. In both cases, though, the large polymer grains evident after a polymerizing low-F/C fluorocarbon main etch are not apparent. One possible conclusion is that the more uniform structure of the polymeric surface layer developed in the pretreatment reduces the granularity of the main etch polymer, thus preventing overhangs that initiate the polymer stripes that result in striations. However, this mechanism has not been confirmed.

The above recipes do not use a magnetic field during the photoresist plasma pretreatment. However, the relatively low magnetic fields used in the main etch are not expected to have a major effect on the treatment chemistry. Other types of MERIE reactors, though, use substantially higher fields of about 120 gauss, which are expected to have a significant though unknown effect on the pretreatment.

Pretreatment plasmas of other noble gases such as helium, neon, or xenon are expected to provide similar beneficial results. Pretreatment plasma including other hydrofluoromethanes are also expected to provide beneficial results. The use of fluoroethane plasmas without the inclusion of yet heavier fluorocarbons needs to be investigated.

A third embodiment of the invention uses a pretreatment gas containing difluoromethane, carbon monoxide, and other common etching gas components but without a diluent gas. The two-step etch recipe is summarized in TABLE 3.

TABLE 3

|  |  | Condition | Main Etch |
|---|---|---|---|
| Flow (sccm) | $CH_2F_2$ | 10 | 0 |
|  | $C_4F_8$ | 10 | 0 |
|  | $C_4F_6$ | 0 | 30 |
|  | CO | 100 | 0 |
|  | $O_2$ | 10 | 20 |
|  | Ar | 0 | 600 |
| Pressure (milliTorr) |  | 60 | 40 |
| Magnetic Field (gauss) |  | 50 | 100 |
| RF Power (W) |  | 1600 | 2000 |
| Time(s) |  | 40 | 180 |

Figure 12:
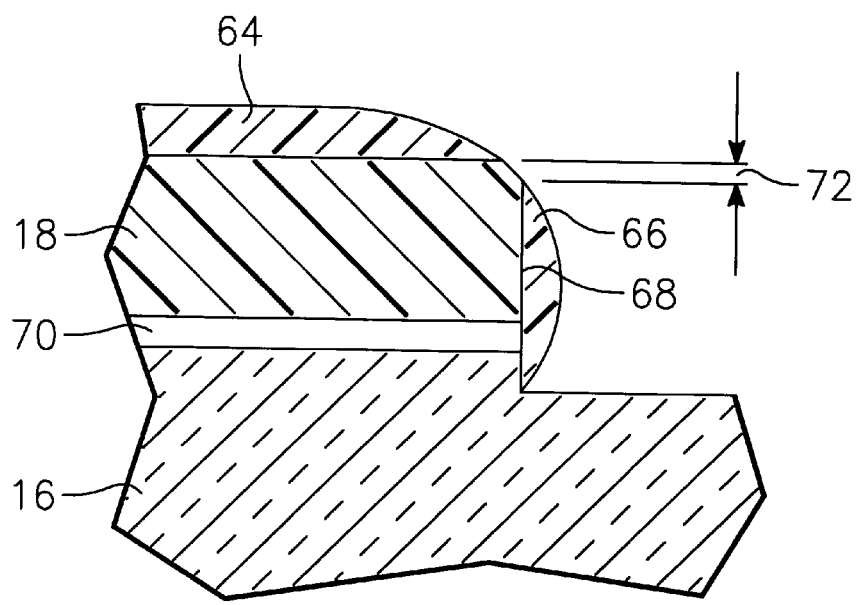
FIG. 12 is a cross-sectional view illustrating the shape of the protective polymer formed according to the third embodiment of the invention.

The pretreatment includes difluoromethane ($CH_2F_2$), and its presence or that of a similar hydrofluorocarbon is considered crucial for this embodiment in which, as illustrated in the cross-sectional view of FIG. 12, a protective polymer 64 is formed over both the top of the photoresist layer 18 and in a shoulder 66 extending over the photoresist sidewall 68. This view also shows a BARC layer 70 which is usually intermediate the oxide layer 16 and the photoresist layer 18. Striations may form in the polymer shoulder 66, but the retrograde angle at the bottom of the shoulder 66 seems to prevent striations from propagating downwardly into the oxide 16 as long as the shoulder 66 remains during the main etch so as to form a protective polymer at the photoresist corner. The combination of the top and shoulder polymer protects the photoresist corner and results in only a minimal amount 72 of photoresist faceting. $C_4F_8$ is a polymerizing gas, as is $CH_2F_2$, and the polymer forms on the flat photoresist top surface, resulting in a net gain in resist/polymer thickness without degrading the photographic resolution. On the other hand, trifluoromethane used in place of difluoromethane together with carbon monoxide forms the top surface polymer but not the shoulder polymer formed by difluoromethane. Monofluoromethane ($CH_3F$) is even more polymerizing than $CH_2F_2$ and can be alternatively used. The carbon monoxide (CO) is known to scavenge fluorine so that the polymer formed is carbon rich, similar to the photoresist.

The oxygen prevents excessive polymerization. The absence of argon in the pretreatment prevents substantial etching of the oxide during pretreatment.

The conditioning recipe of TABLE 3 was varied for different amounts of difluoromethane and carbon monoxide and the photoresist faceting was compared. The recipe of TABLE 3 shows a faceting of about 50 mm after about 65 s of the precondition plasma. When the recipe was changed to either 10 sccm of $CH_2F_2$ and 200 sccm of CO or 15 sccm of $CH_2F_2$ and 200sccm of CO, no faceting was observed and a slight increase of corner resist/polymer thickness was observed for longer periods.

The conditioning recipe of TABLE 3 with $CH_2F_2$ contains no argon diluent gas. Of course, a small amount, for example, of less than 25% could be added without a major effect. The very high amount of carbon monoxide, at least twice that of difluoromethane, is important in determining the composition of the protective polymer. The pretreatment recipe more resembles a main etch in its use of a magnetic field and an RF power close to that of a main etch. The main etch recipe of TABLE 3 is one recently developed by others at Applied Materials. The hexafluorobutadiene ($C_4F_6$) used as the polymerizing gas in the main etch can be used in place of $C_4F_8$ in the photoresist conditioning.

Other main oxide etch recipes are also known. Prevalent etch mixtures include $C_4F_8$/Ar, $CHF_3$/$CF_4$/Ar, $CHF_3$/$CF_4$/$N_2$/Ar, $CHF_3$/$C_4F_8$/$O_2$/$N_2$/Ar, $C_2F_6$/$C_4F_8$/Ar, $CF_4$/$C_4F_8$/Ar, $CF_4$/$C_4F_8$/$O_2$/$N_2$/Ar, $C_4F_8$/$O_2$/Ar/CO, etc. A recipe recently developed by others at Applied Materials includes $C_4F_6$/$O_2$/CO/Ar. Another recipe uses octafluoropentadiene ($C_5F_8$). These last two fluorocarbons have F/C ratios of 1.5 and 1.6 respectively, compared to a ratio of 2 for $C_4F_8$. As previously described, a low-F/C fluorocarbon is defined to have a ratio of fluorine to carbon atoms of no more than two and at the most one hydrogen atom. A low-F/C fluorocarbon is a good polymerizing gas. Fluorocarbons having an F/C ratio of 3 or 4, such as $CF_4$ and $C_2F_6$, on the other hand are strong etchers but provide poor selectivity to oxide or photoresist. Excessive polymerization, for example, with F/C≈1, may result in chemical vapor deposition, not etching. A gas containing hydrogen tends to be polymerizing. Difluoromethane ($CH_2F_2$) is more polymerizing than trifluoromethane ($CHF_3$). By mixing two gases, one etching and the other polymerizing, a balanced selective etch without etch stop is obtained. An alternate approach is to mix a polymerizing gas with oxygen or nitrogen to balance the polymerization and etching. Carbon monoxide (CO) is used to scavenge fluorine, as also does hydrogen in hydrofluorocarbons.

In reducing striations, the choice of the main etch recipes is also important. The beneficial effects of the photoresist pretreatment can be overwhelmed by a main etch chemistry that is too susceptible to striations. Furthermore, the choice of the details of the oxide or other dielectric layer, for example, whether it is TEOS silica or BPSG (borophosphosilicate glass) spun-on silica, and the composition and treatment of the photoresist continue to be important in reducing the formation of striations and in achieving the satisfactory benefits of the photoresist treatment. In view of the belief that striations originate in the photoresist, the photoresist composition and its chemistry also impact the severity of striations.

The photoresist pretreatment can also be practiced on high-plasma density (HDP) etch reactors, such as those using an RF inductive coil as a plasma power source separate from the RF biasing of the pedestal electrode.

An advantage of the photoresist pretreatment described above is that it can be performed in a relatively short time in the same plasma etch reactor used for the main oxide etch. Other types of photoresist pretreatment, such as annealing are known, but these tend to take longer and should be performed in separate annealing chambers. Furthermore, the gases known to be effective in the plasma pretreatment of the photoresist are those already widely used in semiconductor fabrication.

Thus, the photoresist pretreatment of the invention provides a simple and economical means to reduce the severity of if not eliminate a problem that has plagued the etching of narrow holes in dielectric materials.

What is claimed is:

1. A plasma oxide etch process comprising the steps of:
   placing a substrate including an oxide layer covered with a patterned photoresist layer onto a pedestal in a plasma etch reactor;
   a first step of plasma treating in said reactor the photoresist layer with a first level of RF power applied to said chamber to create a plasma therein and with a first gas mixture including a first gas selected from a noble gas and a fluoromethane of at least three fluorine atoms and not including more than 5% of a fluorocarbon having an F/C ratio of 2 or less; and
   a subsequent second step of plasma etching in the reactor the oxide to form a hole therein with a second level of RF power greater than said first level applied to said chamber and with a second gas mixture including a fluorocarbon having an F/C ratio of no more than two and no more than 1 hydrogen atom;
   whereby said plasma treating reduces an occurrence of striations on a sidewall of said hole in said oxide.

2. The process of claim 1, wherein a plasma continues in said reactor between said first and second steps.

3. The process of claim 1, wherein said plasma treating and etching are performed in a single plasma etch reactor without breaking vacuum therebetween.

4. The process of claim 1, wherein said first gas mixture includes a noble gas.

5. The process of claim 4, wherein said noble gas is argon.

6. The process of claim 4, wherein said first gas mixture consists of said noble gas.

7. The process of claim 6, wherein said noble gas is argon.

8. The process of claim 1, where said first gas mixture includes carbon tetrafluoride.

9. The process of claim 8, wherein said first gas mixture consists of said carbon tetrafluoride and trifluoromethane.

10. The process of claim 1, wherein said photoresist layer directly overlies said oxide layer.

11. The process of claim 1, wherein said pedestal is a pedestal electrode and said first and second steps apply said RF power to said pedestal electrode.

12. The process of claim 11, wherein said first level of RF power is no more than 800 W normalized to a 200 mm-diameter substrate.

13. The process of claim 11, wherein said plasma etch reactor is a capacitively coupled reactive ion etch reactor.

14. The process of claim 13, wherein said reactor is a magnetically enhanced capacitively coupled reactive ion etch reactor.

15. The process of claim 14, wherein said etch reactor includes at least one magnetic coil for creating a magnetic field for magnetic enhancement, and wherein said plasma treating step is performed with a level of magnetic field less than that used in said etching step.

16. An oxide etch process for etching a hole in an oxide layer overlain by a photomask of patterned photoresist, comprising the steps of:

plasma treating said photomask with a first plasma principally comprising argon and not including more than 5% of a fluorocarbon having an F/C ratio of two or less; and subsequently etching said oxide layer with a second plasma including a fluorocarbon having an F/C ratio of no more than two and no more than one carbon atom.

17. The process of claim 16, wherein said plasma treating and said etching are performed in a same plasma reaction chamber.

18. The process of claim 17, firther comprising placing a substrate comprising said oxide and photomask onto a pedestal electrode in said plasma reaction chamber;

wherein said plasma treating step includes applying a first level of RF power to said pedestal electrode; and wherein said etching step includes applying a second level of RF power less than said first level to said pedestal electrode.

19. The process of claim 18, wherein said first level of RF power is less than 800 W normalized to a 200 mm-diameter substrate.

20. A process for pretreating patterned photoresist, comprising subjecting the photoresist to a plasma of a pretreatment gas comprising a fluoromethane selected from the group consisting of difluoromethane and monofluoromethane and carbon monoxide but substantially no diluent gas.

21. The process of claim 20, further comprising the subsequent step of subjecting an oxide layer underlying the patterned photoresist to a plasma of an etching gas comprising a fluorocarbon other than difluoromethane and monofluoromethane and a diluent gas.

22. The process of claim 20, wherein said fluoromethane is difluoromethane.

23. The process of claim 20, wherein said pretreatment gas includes at least twice an amount of carbon monoxide as said fluoromethane.

24. The process of claim 20, said pretreatment gas further comprises oxygen.

25. A plasma oxide etch process, comprising the steps of:

placing a substrate including an oxide layer covered with a patterned photoresist layer onto a pedestal in a plasma etch reactor;

a first step of plasma treating in said reactor the photoresist layer with a first level of RF power applied to said chamber to create a plasma therein and with a first gas mixture including a first gas selected from a noble gas and a fluoromethane of at least three fluorine atoms and not including more than 5% of a fluorocarbon having an F/C ratio of 2 or less; and a subsequent second step of plasma etching in the reactor the oxide layer according to a pattern of said plasma treated photoresist layer to form a hole in said oxide layer, said plasma etching being performed with a second level of RF power greater than said first level applied to said chamber and with a second gas mixture including a fluorocarbon having an F/C ratio of no more than two and no more than 1 hydrogen atom.

26. The process of claim 25, wherein said first gas mixture consists essentially of argon.

27. The process of claim 25, wherein said first gas mixture consists essentially of a gas selected from the group consisting of $CF_4$ and $CHF_3$.

28. The process of claim 27, wherein said first gas mixture consists essentially of a combination of $CF_4$ and $CHF_3$.

* * * * *